United States Patent
Shimizu

(10) Patent No.: US 10,462,948 B2
(45) Date of Patent: Oct. 29, 2019

(54) MOUNTING DEVIATION CORRECTION APPARATUS AND COMPONENT MOUNTING SYSTEM

(71) Applicant: FUJI CORPORATION, Chiryu (JP)

(72) Inventor: Koji Shimizu, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 356 days.

(21) Appl. No.: 15/125,470

(22) PCT Filed: Mar. 13, 2014

(86) PCT No.: PCT/JP2014/056657
§ 371 (c)(1),
(2) Date: Sep. 12, 2016

(87) PCT Pub. No.: WO2015/136662
PCT Pub. Date: Sep. 17, 2015

(65) Prior Publication Data
US 2017/0112029 A1    Apr. 20, 2017

(51) Int. Cl.
| B23P 19/00 | (2006.01) |
| H05K 13/04 | (2006.01) |
| H05K 13/00 | (2006.01) |
| H05K 13/08 | (2006.01) |

(52) U.S. Cl.
CPC ......... H05K 13/04 (2013.01); H05K 13/0053 (2013.01); H05K 13/0413 (2013.01); H05K 13/0815 (2018.08); *Y10T 29/53261* (2015.01)

(58) Field of Classification Search
CPC ............... H05K 13/04; H05K 13/0815; H05K 13/0053; H05K 13/0413; H05K 3/303; H05K 3/341; Y10T 29/53178; Y10T 29/53174; Y10T 29/4913; Y10T 29/49133; Y10T 29/49826; Y10T 29/53; Y10T 29/53009; Y10T 29/53261
USPC ......... 29/759, 705, 739, 740, 743, 829, 832, 29/834, 837
See application file for complete search history.

(56) References Cited

U.S. PATENT DOCUMENTS

| 5,285,946 A * | 2/1994 | Tomigashi | ......... H05K 13/0409 228/9 |
| 2003/0027363 A1* | 2/2003 | Kodama | ............ G05B 19/4065 438/14 |

(Continued)

FOREIGN PATENT DOCUMENTS

| CN | 101390456 A | 3/2009 |
| JP | 4-800 A | 1/1992 |
| JP | 2005-166769 A | 6/2005 |

(Continued)

OTHER PUBLICATIONS

English translation of JPH4800.*

(Continued)

*Primary Examiner* — Thiem D Phan
(74) *Attorney, Agent, or Firm* — Oblon, McClelland, Maier & Neustadt, L.L.P.

(57) ABSTRACT

In a case in which mounting deviation is occurring in a component which is mounted onto a solder surface of a board, a pad jig is pushed against the component, and the mounting deviation of the component is corrected through a friction force between the pad jig and the component by causing the pad jig to move in a horizontal direction.

11 Claims, 13 Drawing Sheets

(56) References Cited

U.S. PATENT DOCUMENTS

2006/0241888 A1* 10/2006 Takahama ............... H02G 1/04
702/127
2009/0000110 A1   1/2009 Maenishi

FOREIGN PATENT DOCUMENTS

| JP | 4809251 B2 | 8/2011 |
| JP | 2013008789 A * | 1/2013 |
| WO | WO 2007/100022 A1 | 9/2007 |

OTHER PUBLICATIONS

English translation of JP2007258679.*
International Search Report dated May 20, 2014 in PCT/JP2014/056657 Filed Mar. 13, 2014.
Combined Office Action and Search Report dated Aug. 1, 2018 in Chinese Patent Application No. 201480077027.9, 16 pages (with English translation and English translation of categories of cited documents).

* cited by examiner (a)

(b)

(c)

(a)

(b)

(c)

(a)

(b)

MOUNTING DEVIATION CORRECTION APPARATUS AND COMPONENT MOUNTING SYSTEM

TECHNICAL FIELD

The present application relates to a mounting deviation correction apparatus which corrects mounting deviation of a mounted component which is mounted onto a board, and relates to a component mounting system.

BACKGROUND ART

In the related art, a correction device is known which mounts a component onto a board using soldering, performs inspection, and, when it is determined that the inspection results are unsatisfactory, the correction device corrects the unsatisfactory location. For example, PTL 1 discloses a correction device which is provided with a board conveyance section which conveys the board in which the inspection results are determined to be unsatisfactory to a correction position, and a correction head which moves at the correction position due to an XY robot and performs correction work, in which the correction head sucks a correction target component using a suction nozzle connected to a vacuum source to remove the correction target component from the board while heating connection terminals of the correction target component using a laser beam.

PTL 1. JP-A-5-235536

SUMMARY

Incidentally, in a case in which mounting deviation arises in the mounted component which is mounted onto the board by the component mounting machine, by using the mounting deviation correction apparatus described in PTL 1, it is possible to remove the component in which mounting deviation is arising from the board, and it is possible to eliminate component removing work which takes labor of a worker. However, in the case of the correction device described above, after removing the component from the board, it is necessary for the worker to perform work of re-mounting a new component.

A main object of the present disclosure is to provide a mounting deviation correction apparatus which automatically corrects mounting deviation of a mounted component which is mounted to a board.

The present disclosure adopts the following device in order to achieve the above-described main object.

A mounting deviation correction apparatus is a mounting deviation correction apparatus which corrects mounting deviation of a mounted component which is mounted onto a board including a contact holding member which includes an abutting section which holds the mounted component, a movement device that moves the contact holding member, a positional information acquisition device that acquires positional information of the mounted component in which mounting deviation is arising in relation to the board, a contact holding control device that controls the movement device such that the contact holding member is moved until the abutting section holds the mounted component in which the mounting deviation is arising based on the acquired positional information, and a mounting deviation correction control device that controls the movement device such that the contact holding member moves in a direction which cancels out the mounting deviation of the mounted component based on the positional information which is acquired in a state in which the abutting section holds the mounted component.

In the mounting deviation correction apparatus, the positional information of the mounted component in which the mounting deviation is occurring in relation to the board is acquired, the contact holding member is moved until the abutting section holds the mounted component in which the mounting deviation is occurring based on the acquired positional information, and the contact holding member is moved in a direction which cancels out the mounting deviation of the mounted component based on the positional information which is acquired in a state in which the abutting section holds the mounted component. Accordingly, it is possible to automatically correct the mounting deviation of the mounted component which is mounted onto the board without removing the mounted component from the board.

In the mounting deviation correction apparatus, it is possible to adopt a configuration in which the abutting section includes an abutting surface which is formed of a friction member, and the contact holding control device is a device that controls the movement device so as to cause the abutting surface to push the mounted component. Here, it is possible to define "the abutting surface to push the mounted component" as the abutting surface pushing the mounted component in a direction perpendicular to the board in a case in which the mounting deviation of the mounted component is corrected by moving the contact holding member in a direction which is parallel to the board in a state in which the mounted component which is mounted onto the board is caused to contact the abutting surface. It is possible to define "abutting surface to push the mounted component" as causing the abutting surface to push the mounted component so as to obtain a degree of friction force with which the mounted component moves in the same direction as the contact holding member when the contact holding member is moved in a state in which the abutting surface is in contact with the mounted component. Specifically, it is possible to adopt a configuration in which the abutting surface is further moved by a predetermined amount in a direction which is perpendicular to the board from a state in which the abutting surface is in contact with the mounted component, and it is possible to adopt a configuration in which the abutting surface is moved in a direction which is perpendicular to the board such that the push-in load of the abutting surface becomes a predetermined load.

Alternatively, in the mounting deviation correction apparatus, it is possible to adopt a configuration in which the mounted component is a rectangular prism shaped component, and the abutting section includes a valley-shaped abutting surface which is capable of coming into contact with at least two opposite sides of an upper surface of the mounted component. Therefore, it is possible to more reliably hold the mounted component and to correct the mounting deviation thereof.

In the mounting deviation correction apparatus, it is possible to adopt a configuration in which the abutting section includes a separating mechanism which moves the contact holding member in a direction which cancels out the mounting deviation of the mounted component in a state in which the abutting section holds the mounted component, and subsequently causes the abutting section to separate from the mounted component. Therefore, it is possible to suppress take-back of the mounted component by the contact holding member after the contact holding member corrects the mounting deviation of the mounted component.

In the mounting deviation correction apparatus, it is possible to adopt a configuration in which the mounting deviation correction apparatus further includes a component information acquisition device that acquires component information relating to a shape of the mounted component, and the contact holding control device is a device that controls the movement device such that the abutting section pushes the mounted component based on the acquired component information. Therefore, it is possible to push the mounted component using the abutting section of the contact holding member with an appropriate pushing force, and it is possible to more reliably hold the mounted component regardless of the shape of the mounted component. It is possible to use the same embodiment as the previously described embodiments for "the abutting surface to push the mounted component".

In the mounting deviation correction apparatus of an embodiment in which the movement device is controlled such that the abutting section pushes the mounted component based on the component information, it is possible to adopt a configuration in which the mounting deviation correction apparatus further includes a support member which supports the board at a predetermined position, and a warning device that performs a predetermined warning in a case in which a mounting position of the mounted component which is specified based on the acquired positional information is not within a predetermined region including the predetermined position. Therefore, it is possible to prevent the occurrence of warping or damage to the board when the abutting section of the contact holding member is pushed into the mounted component.

In the mounting deviation correction apparatus of an embodiment in which the movement device is controlled such that the abutting section pushes the mounted component based on the component information, it is possible to adopt a configuration in which the mounting deviation correction apparatus further includes a push-in amount detection device that detects a push-in amount of the abutting section, and an error information output device that outputs error information in a case in which the detected push-in amount exceeds a predetermined amount. Therefore, it is possible to prevent the occurrence of warping or damage to the board when the abutting section of the contact holding member is pushed into the mounted component.

In the mounting deviation correction apparatus, it is possible to adopt a configuration in which the mounting deviation correction apparatus further includes an inspection device that inspects whether or not mounting deviation is present in the mounted component which is a control target after the controlling by the mounting deviation correction control device.

A component mounting system is a component mounting system which configures a mounting line which is provided with a printer which prints solder onto a board, a component mounting machine which mounts a component onto the board onto which the solder is printed by the printer, an inspector which inspects whether or not mounting deviation is present in the component which is mounted onto the board, and a reflow furnace which melts the solder by heating the board after the inspection to perform soldering, the component mounting system including the mounting deviation correction apparatus according to the present disclosure of any of the embodiments described above which corrects the mounting deviation of the mounted component for which it is determined by the inspector that the mounting deviation is occurring, in which the mounting deviation correction apparatus is incorporated in the mounting line.

In the component mounting system, because the mounting deviation correction apparatus is incorporated into a mounting line which is formed of a printer, a component mounting machine, an inspector, and a reflow furnace, it is possible to efficiently correct mounting deviation of a mounted component. Here, the mounting deviation correction apparatus may be incorporated alone in a mounting line, and may be incorporated in another device according to a mounting line. In the first case, because the mounting deviation correction apparatus corrects the mounting deviation of the mounted component for which it is determined that mounting deviation is occurring by the inspector, the mounting deviation correction apparatus may be disposed on the downstream side of the inspector of the mounting line and on the upstream side of the reflow furnace. In a case in which a plurality of inspectors are disposed (for example, disposed on a mounting line as in a component mounting machine, an inspector, a component mounting machine, an inspector, and so on), the mounting deviation correction apparatus may be disposed on the downstream side of each of the plurality of inspectors. In the latter case, the mounting deviation correction apparatus may be incorporated in an inspector, and in a case in which the inspection function is added to one or a plurality of component mounting machines (a case in which an inspection device is incorporated in the component mounting machine), the mounting deviation correction apparatus may be incorporated in the component mounting machine.

DESCRIPTION OF EMBODIMENTS

Next, description will be given of an embodiment of the present disclosure.

Figure 1:
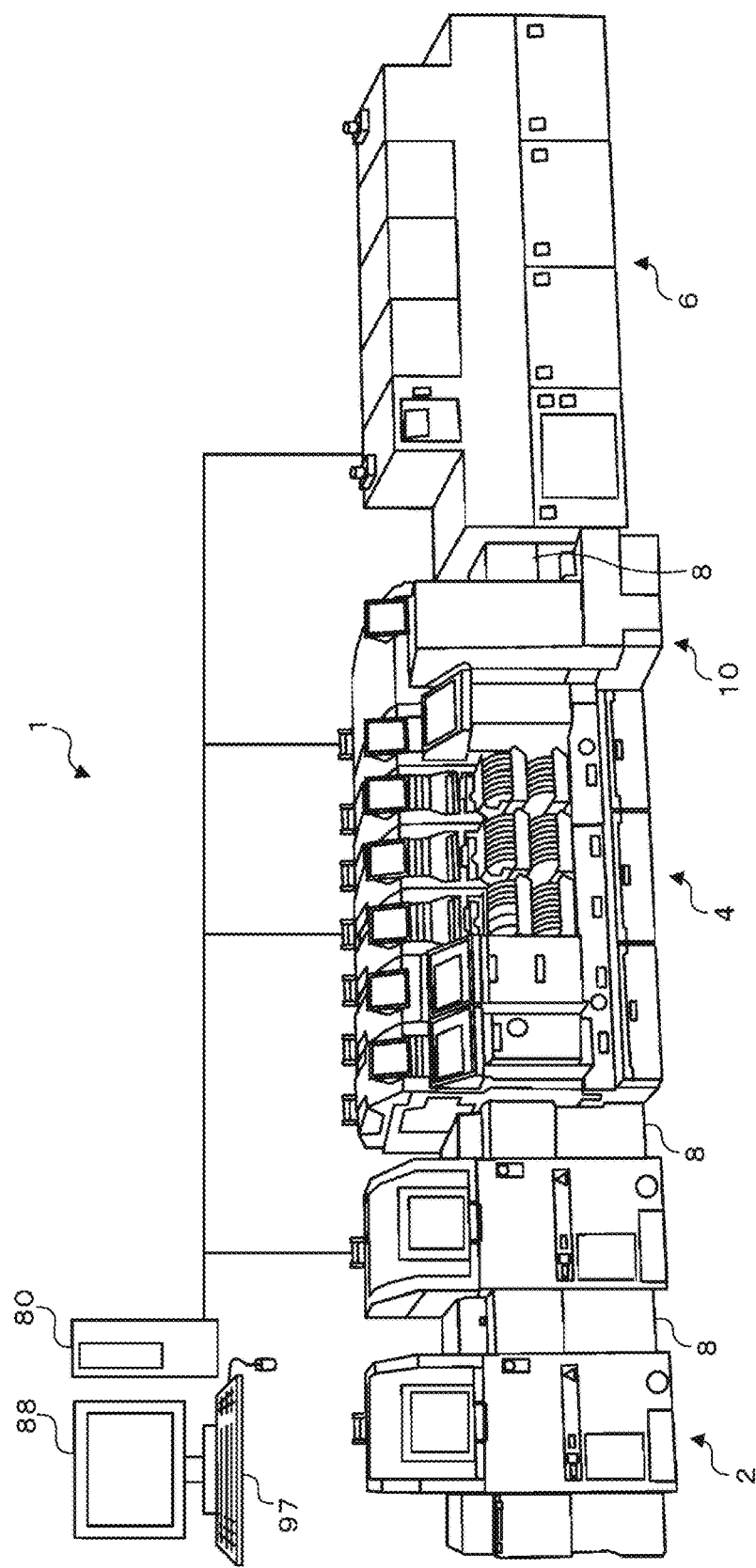
FIG. 1 is a configuration diagram schematically illustrating the configuration of a component mounting system 1 which is an embodiment of the present disclosure.
Figure 2:
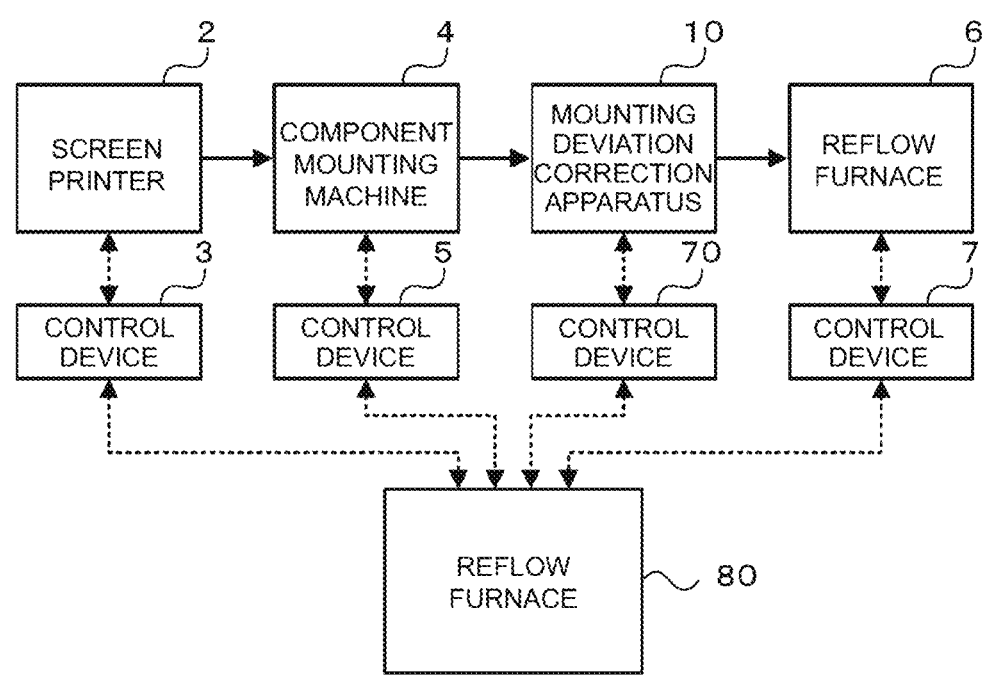
FIG. 2 is an explanatory diagram illustrating an electrical connection relationship between respective control devices 3, 5, 70, and 7 of a screen printer 2, a component mounting machine 4, a mounting deviation correction apparatus 10, and a reflow furnace 6 and a management device 80.
Figure 3:
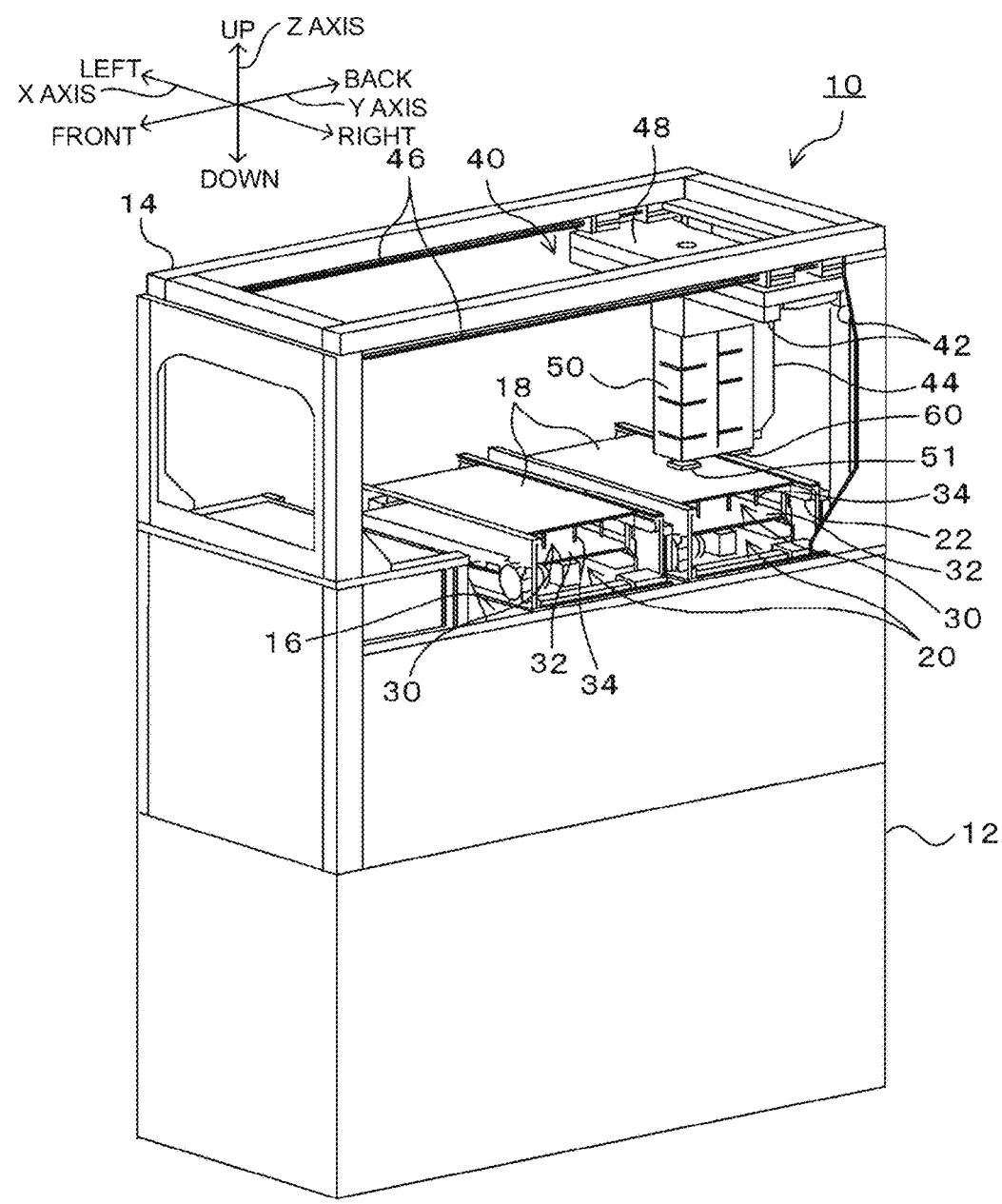
FIG. 3 is a configuration diagram schematically illustrating the configuration of the mounting deviation correction apparatus 10.
Figure 4:
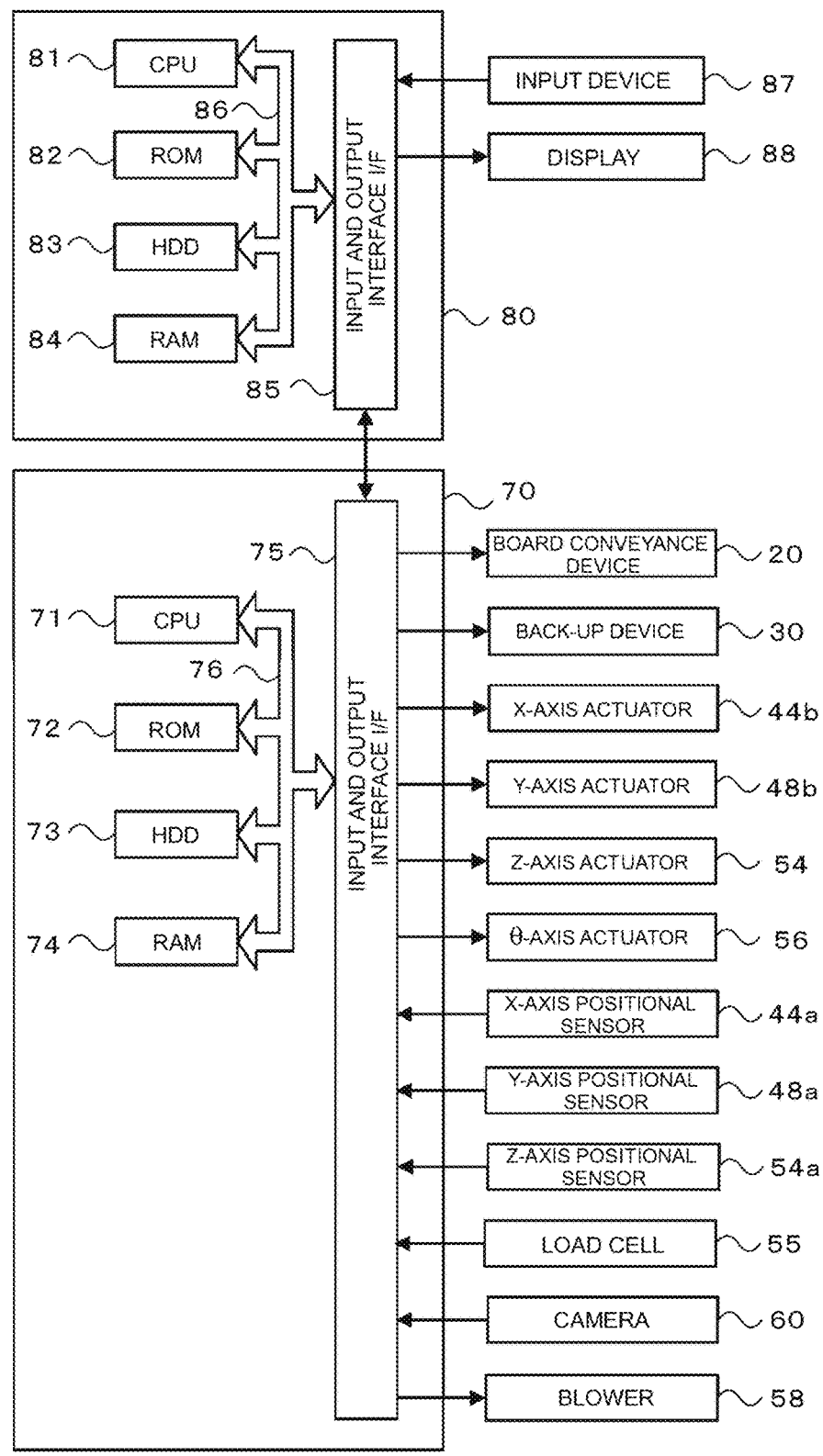
FIG. 4 is a block diagram illustrating a detailed electrical connection relationship between the control device 70 and the management device 80 of the mounting deviation correction apparatus 10.

FIG. 1 is a configuration diagram schematically illustrating the configuration of the component mounting system 1 which is an embodiment of the present disclosure, FIG. 2 is an explanatory diagram illustrating the electrical connection relationship between the respective control devices 3, 5, 70, and 7 of the screen printer 2, the component mounting machine 4, the mounting deviation correction apparatus 10, and the reflow furnace 6 and the management device 80, FIG. 3 is a configuration diagram schematically illustrating the configuration of the mounting deviation correction apparatus 10, and FIG. 4 is a block diagram illustrating the detailed electrical connection relationship between the control device 70 and the management device 80 of the mounting deviation correction apparatus 10. In the present embodiment, a left-right direction of FIG. 3 is an X-axis direction, a forward-backward direction is a Y-axis direction, and an up-down direction is a Z-axis direction.

As illustrated in FIG. 1 or FIG. 2, the component mounting system 1 is provided with a plurality of the screen printers 2 each of which pushes solder on a screen into patterning which are formed in the screen while rolling the solder using a squeegee to print a circuit pattern (a solder surface S) onto a circuit board 18 (hereinafter referred to simply as a "board") thereunder via the patterning holes, a control device 3 which controls the screen printers 2, a plurality of the component mounting machines 4 which mount electronic components C (hereinafter referred to simply as "components") onto the solder surface S of the board 18 which is subjected to printing by the screen printers 2, a control device 5 which controls the component mounting machines 4, the mounting deviation correction apparatus 10 which inspects whether or not mounting deviation is present in the components C which are mounted onto the board 18 and corrects the mounting deviation of the components C, the control device 70 which controls the mounting deviation correction apparatus 10, the reflow furnace 6 which melts the solder on the board 18 by heating the board 18 to perform the soldering, a control device 7 which controls the reflow furnace 6, and the management device 80 which is connected to be capable of communication with the control devices 3, 5, 70, and 7 and manages the overall component mounting system 1. An intermediate conveyor 8 joins the space between the devices 2, 4, 10, and 6 to form a single mounting line in the entirety of the component mounting system 1.

As illustrated in FIG. 3, the mounting deviation correction apparatus 10 is provided with a board conveyance device 20 which conveys the board 18, a back-up device 30 which backs up the board 18 which is conveyed by the board conveyance device 20 from the reverse surface side, the head 50 for holding the component C and correcting the mounting deviation thereof, an XY robot 40 which moves the head 50 in the XY directions, and the control device 70 (refer to FIG. 4) which manages the overall control of the mounting deviation correction apparatus, in which the board conveyance device 20, the back-up device 30, the head 50, and the XY robot 40 are stored in a main body frame 14 which is installed on a base 12.

As illustrated in FIG. 3, the board conveyance device 20 is configured as a dual lane system conveyance device in which two board conveyance paths are provided, and is disposed on a support table 16 which is provided in a middle level portion of the main body frame 14. Each of the board conveyance paths is provided with a belt conveyor device 22, and the board 18 is conveyed from left to right in FIG. 3 (a board conveyance direction) by the driving of the belt conveyor device 22.

The back-up device 30 is provided with a back-up plate 32 which is installed to be capable of lifting and lowering due to a lifting and lowering device which is not depicted in the drawings, and a plurality of back-up pins 34 which are provided to stand on the back-up plate 32, and the board 18 is backed up from the reverse surface side by raising the back-up plate 32 in a state in which the board 18 is conveyed over the back-up plate 32 by the board conveyance device 20. In the present embodiment, the back-up pins 34 are provided to stand on a circumferential edge portion of the back-up plate 32. Naturally, the back-up pins 34 are not limited to those which are provided to stand on the circumferential edge portion, and may be provided to stand on the inside of the circumferential edge portion as long as the positions do not interfere with the circuit pattern (the solder surface) on the board 18 or the like.

As illustrated in FIG. 3, the XY robot 40 is provided with a Y-axis guide rail 46 which is provided along the Y-axis direction on a top level portion of the main body frame 14, a Y-axis slider 48 capable of movement along the Y-axis guide rail 46, an X-axis guide rail 42 which is provided along the X-axis direction on a bottom face of the Y-axis slider 48, and an X-axis slider 44 capable of movement along the X-axis guide rail 42. A camera 60 for imaging the mounting surface of the board 18 which is backed up by the back-up device 30 is provided on the bottom face of the X-axis slider 44.

Figure 5:
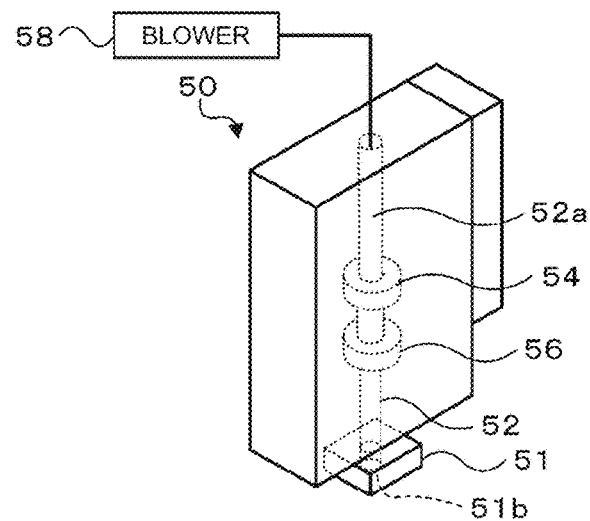
FIG. 5 is a configuration diagram schematically illustrating the configuration of a head 50.

The head 50 is attached in a detachable manner to the side surface of the X-axis slider 44. FIG. 5 is a configuration diagram schematically illustrating the configuration of the head 50. As illustrated in FIG. 5, the head 50 is provided with the pad jig 51 which holds the component C, a jig holder 52 which holds the pad jig 51, a Z-axis actuator 54 which moves the jig holder 52 (the pad jig 51) in the Z-axis direction, and a θ-axis actuator 56 which rotates the jig holder 52 (the pad jig 51) around the Z axis.

Figure 6:
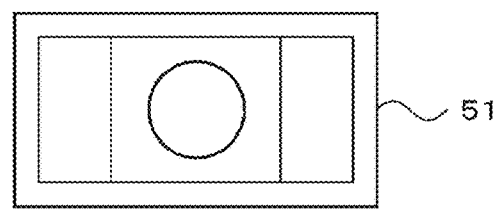
FIG. 6 is a configuration diagram schematically illustrating the configuration of a pad jig 51.
Figure 6:
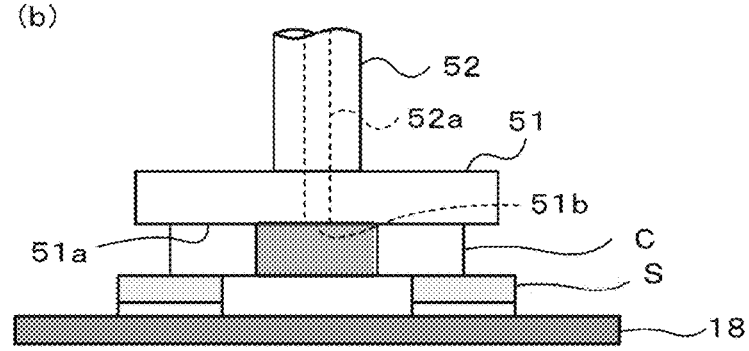
Figure 6:
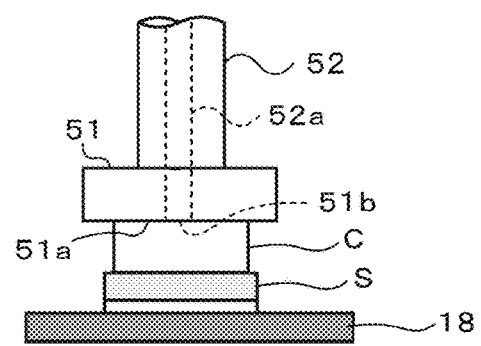

FIG. 6 is a configuration diagram schematically illustrating the configuration of the pad jig 51 with which the head 50 is provided. FIG. 6 (a) is a top view of the pad jig 51, and FIGS. 6 (b) and (c) are side surface diagrams of the pad jig 51. The component C which is held by the pad jig 51 is also depicted in FIGS. 6 (b) and (c). As illustrated in FIG. 6, the pad jig 51 includes an abutting surface 51a which abuts against (makes contact with) the component C which is mounted onto the solder surface S of the board 18. The abutting surface 51a of the pad jig 51 is formed of a planar surface, the friction force (a maximum coefficient of static friction) between the abutting surface 51a and the component C in relation to horizontal movement in a state in which the abutting surface 51a is in contact with the component C is sufficiently great, and a material (for example, rubber or the like) is used with which the component C is not easily lifted by an adhesive force or static electricity during the lifting. In the present embodiment, the pad jig 51 is configured to be detachably attached to the jig holder 52, and is exchanged for an appropriate one according to the shape and the material of the component C. A blow hole 51b for blowing air downward is formed in the center of the rotating shaft of the pad jig 51.

As illustrated in FIG. 5, the jig holder 52 includes an internal passage 52a which communicates with the blow hole 51b, the tip portion of which is formed in the pad jig 51. A blower 58 is connected to the base end portion of the internal passage 52a, and the internal passage 52a is capable of blowing air from the blow hole 51b which is formed in the pad jig 51.

As illustrated in FIG. 4, the control device 70 of the mounting deviation correction apparatus 10 is configured as a microprocessor centered on a CPU 71, in addition to the CPU 71, is provided with a ROM 72 which stores process programs, an HDD 73 which stores various data, a RAM 74 which is used as a working region, and an input and output interface 75, and these are electrically connected via a bus 76. A positional signal from an X-axis positional sensor 44a which detects the position of the X-axis slider 44, a positional signal from a Y-axis positional sensor 48a which detects the position of the Y-axis slider 48, a positional signal from a Z-axis positional sensor 54a which detects the position in the Z-axis direction of the jig holder 52 (the pad jig 51), a detected signal from a load cell 55 which detects a load acting on the jig holder 52 (the pad jig 51), an imaging signal from the camera 60, and the like are input to the control device 70 via the input and output interface 75. Meanwhile, a control signal to the board conveyance device 20, a control signal to the back-up device 30, a drive signal to an X-axis actuator 44b which drives the X-axis slider 44, a drive signal to a Y-axis actuator 48b which drives the Y-axis slider 48, a drive signal to the blower 58, and the like are output from the control device 70 via the input and output interface 75. The control device 70 is connected to be capable of bidirectional communication with the management device 80, and the transaction of data and control signals is performed therebetween.

The management device 80 is a general-purpose computer, for example. As illustrated in FIG. 4, the management device 80 is a microprocessor centered on a CPU 81, is provided with a ROM 82 which stores process programs, an HDD 83 which stores production plans and the like of the board 18, a RAM 84 which is used as a working region, an input and output interface 85, and the like, and these are electrically connected via a bus 86. The management device 80 receives input of input signals from an input device 87 such as a mouse or a keyboard via the input and output interface 85, and image signals are output from the management device 80 to a display 88 via the input and output interface 85. Here, examples of the various information which is input as the production plans include production date, number of the boards 18 to create, component information (for example, the shape, the size, and the like) relating to the components C to be mounted onto the board 18, and nozzle information relating to the suction nozzles which are used to suck the components C in the component mounting machines 4. The production plans are input to the management device 80 by the worker operating the input device 87. The management device 80 acquires the production plans which are input and outputs the respective instruction signals and various information to the screen printer 2, the component mounting machines 4, the mounting deviation correction apparatus 10, and the reflow furnace 6 such that the printing of the circuit pattern (the solder surface S) onto the board 18, the mounting of the components C onto the solder surface 8, the inspection and the correction work of the mounting deviation, and the soldering are performed according to the acquired production plans.

Figure 7:
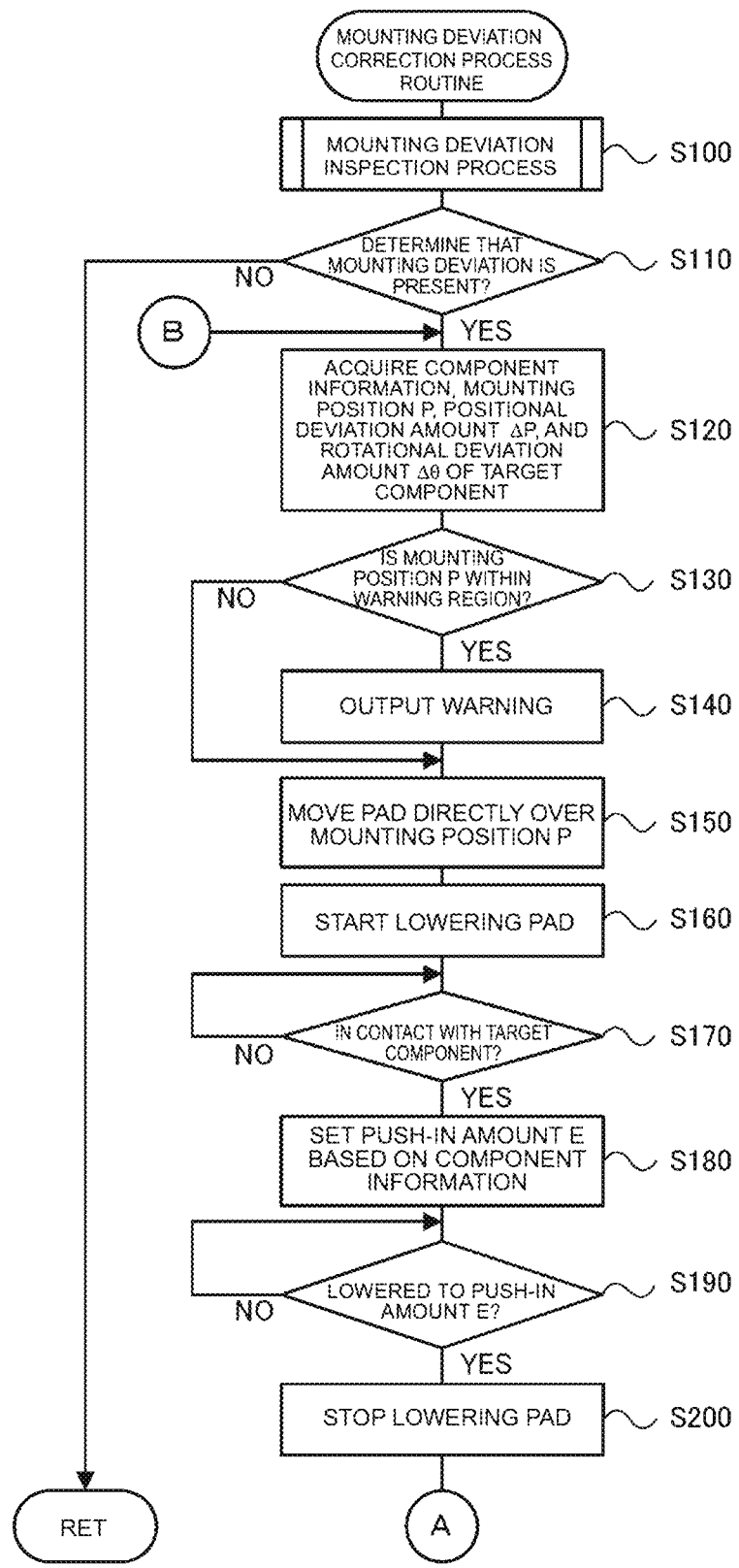
FIG. 7 is a flowchart (first half portion) illustrating an example of a mounting deviation correction process routine which is executed by the control device 70 of the mounting deviation correction apparatus 10.
Figure 8:
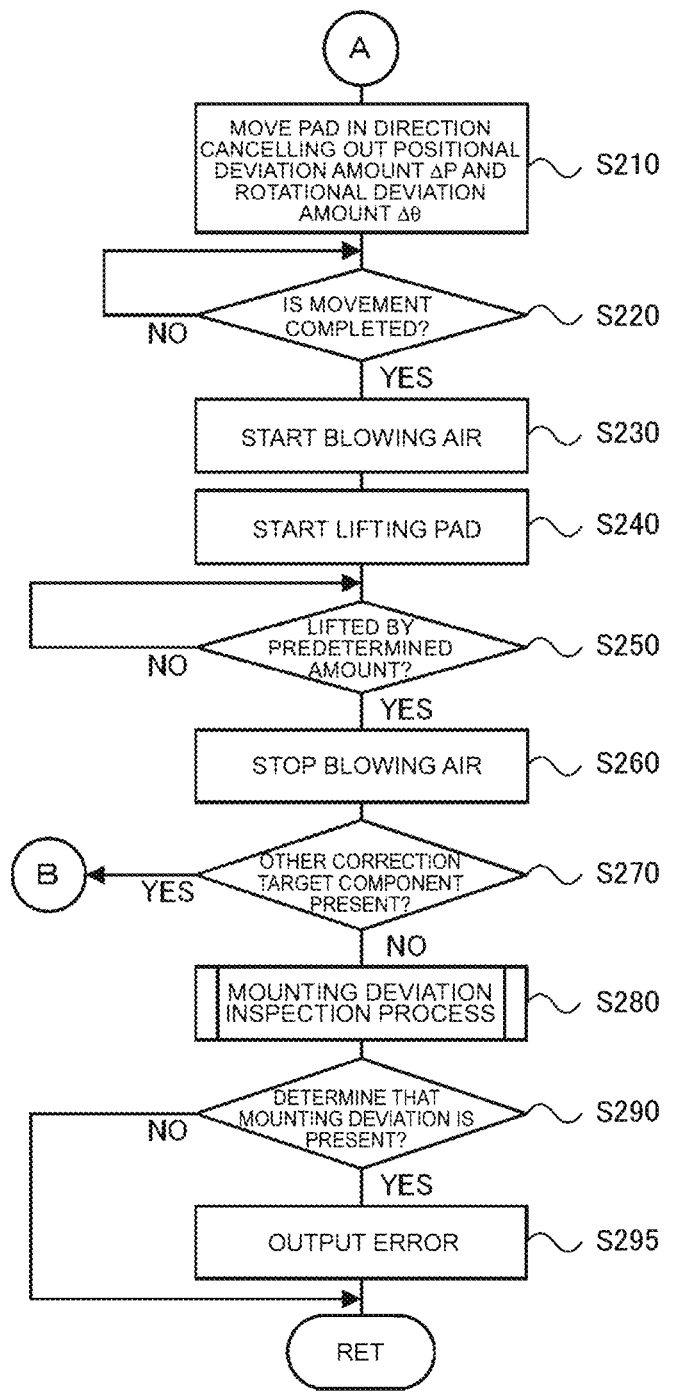
FIG. 8 is a flowchart (second half portion) illustrating an example of a mounting deviation correction process routine which is executed by the control device 70 of the mounting deviation correction apparatus 10.
Figure 9:
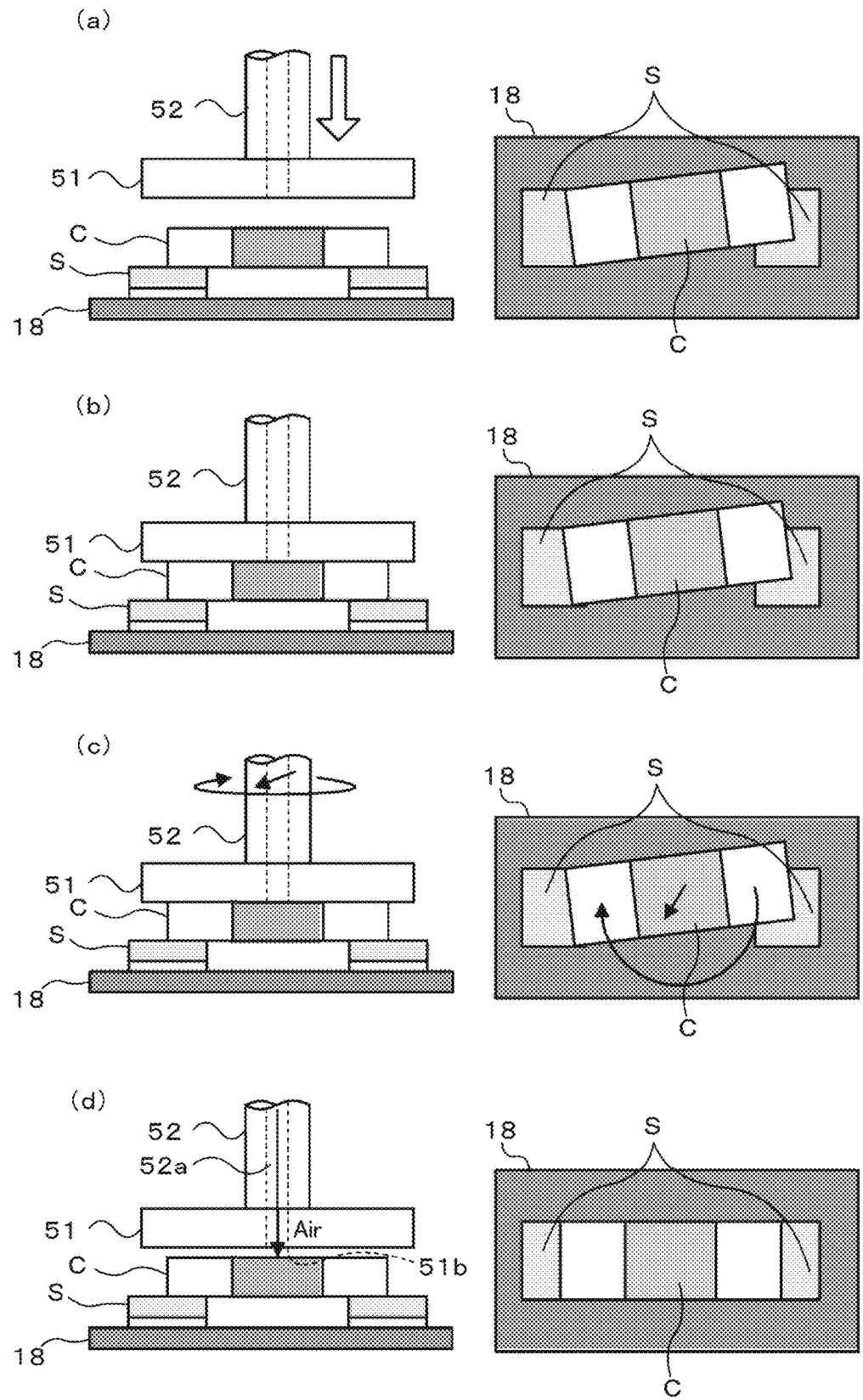
FIG. 9 is an explanatory diagram illustrating a state of mounting deviation correction work.

Next, description will be given of the mounting deviation correction apparatus 10 in the component mounting system 1 which is configured in this manner. FIGS. 7 and 8 are flowcharts illustrating example of the mounting deviation correction process routine which is executed by the control device 70 of the mounting deviation correction apparatus 10. The process is executed when the board 18 onto the solder surface S of which the components C are mounted by the component mounting machine 4 is conveyed by the board conveyance device 20. Hereinafter, description will be given of the mounting deviation correction process routine with reference to FIG. 9 illustrating the state of mounting deviation correction work.

Figure 10:
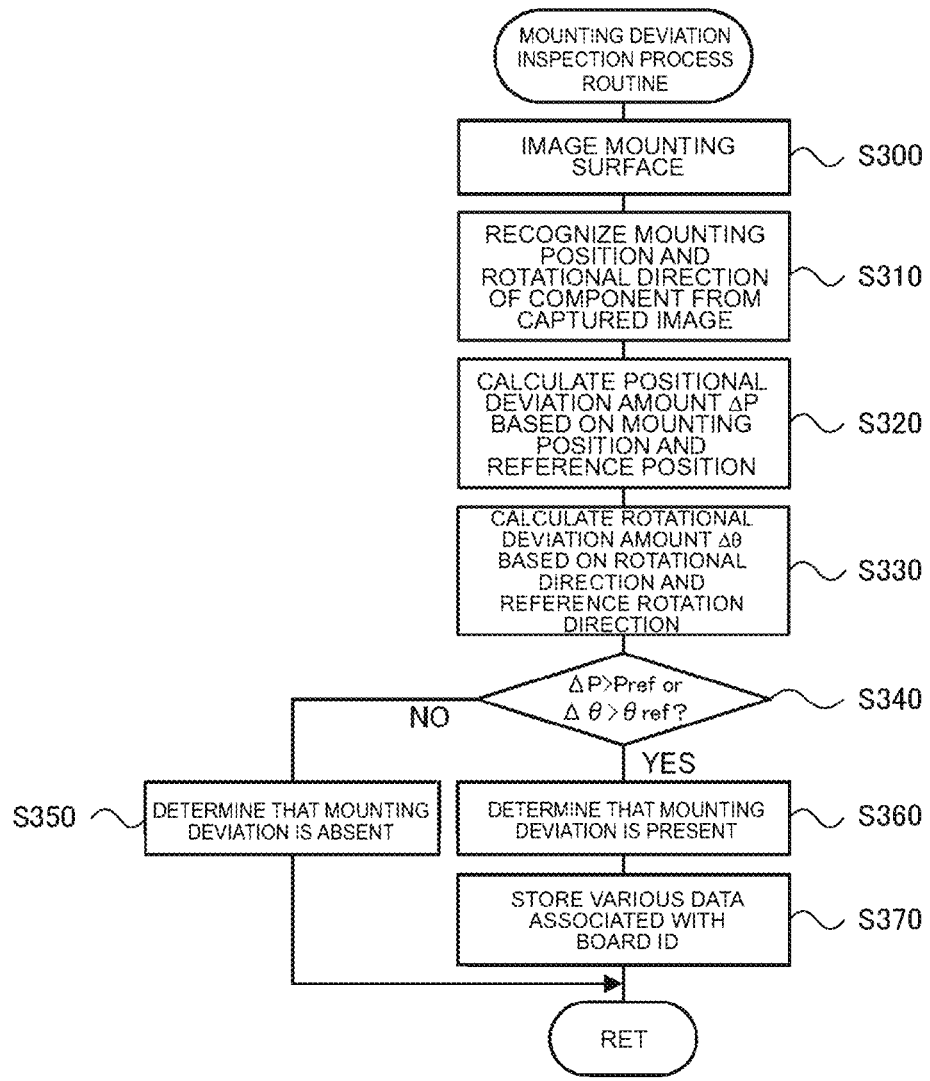
FIG. 10 is a flowchart illustrating an example of a mounting deviation inspection process routine which is executed by the control device 70 of the mounting deviation correction apparatus 10.

When the mounting deviation correction process routine is executed, the CPU 71 of the control device 70 first performs a mounting deviation inspection process which inspects whether or not a mounting deviation is present in the component C which is mounted onto the solder surface S of the board 18 by the component mounting machine 4 (step S100). The process of step S100 is performed by executing the mounting deviation inspection process routine exemplified in FIG. 10. Here, description of the mounting deviation correction process routine will be temporarily interrupted, and description will be given of the mounting deviation inspection process routine of FIG. 10.

When the mounting deviation inspection process routine is executed, the CPU 71 of the control device 70 controls the XY robot 40 (the X-axis actuator 44b and the Y-axis actuator 48b) to move the camera 60 which is attached to the X-axis slider 44 to a position facing the mounting region of the board 18, and subsequently drives the camera 60 to image the mounting region of the board 18 (step S300). Next, the CPU 71 of the control device 70 recognizes a mounting position P (for example, a center coordinate of the component C) and the rotational direction of each of the components C which are mounted onto the board 18 from the captured image by performing image processing on the captured image which is obtained through imaging (step S310), calculates a positional deviation amount $\Delta P$ for each component C by comparing the recognized mounting position P with a reference position (the correct reference position which is stored in advance) (step S320), and calculates a rotational deviation amount $\Delta \theta$ for each component C by comparing the recognized rotational direction with a reference direction (a correct rotational direction which is stored in advance) (step S330). When the positional deviation amount $\Delta P$ and the rotational deviation amount $\Delta \theta$ are calculated for each of the components C, the CPU 71 of the control device 70 determines whether or not the calculated positional deviation amount $\Delta P$ exceeds a threshold Pref and whether or not the calculated rotational deviation amount $\Delta \theta$ exceeds a threshold $\theta$ref for each of the components C (step S340). Here, the threshold Pref and the threshold $\theta$ref are predefined values as allowable ranges of the positional deviation and the rotational deviation of the components C, respectively. When the CPU 71 of the control device 70 determines that the positional deviation amount $\Delta P$ does not exceed the threshold Pref and that the rotational deviation amount $\Delta \theta$ does not exceed the threshold $\theta$ref, the CPU 71 determines that the mounting deviation is absent in the component C relating to the determination (step S350), and ends the mounting deviation inspection process routine. Meanwhile, when the CPU 71 of the control device 70 determines that the positional deviation amount ΔP exceeds the threshold Pref, that the rotational deviation amount Δθ exceeds the threshold θref, or the like, the CPU 71 determines that the mounting deviation is present in the component C relating to the determination (step S360), associates the component information, the mounting position P, the positional deviation amount ΔP, and the rotational deviation amount Δθ of the component C relating to the determination with a board ID, which is identification information of the board 18, stores this in the RAM 74 (step S370), and ends the mounting deviation inspection process routine. In the present embodiment, the mounting position P, the positional deviation amount ΔP, and the rotational deviation amount Δθ correspond to the "positional information" according to the present disclosure.

Figure 11:
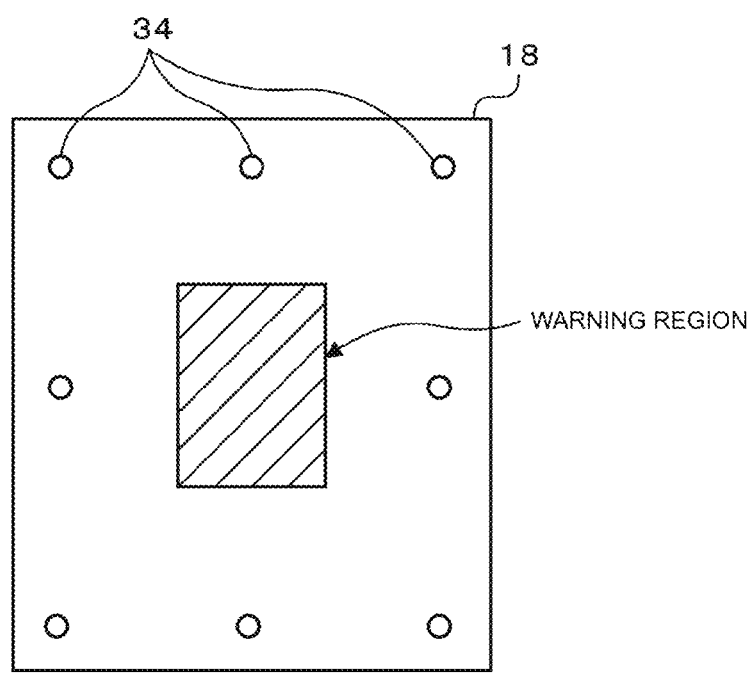
FIG. 11 is an explanatory diagram explaining an example of a warning region of a board 18.

When the CPU 71 of the control device 70 returns to the mounting deviation correct ion process routine and executes the mounting deviation inspection process in this manner, when the CPU 71 determines that the mounting deviation is not present in any of the components C which are mounted onto the board 18 as a result of the mounting deviation inspection process ("NO" in step S110), the CPU 71 ends the mounting deviation correction process routine. Accordingly, the board 18 is conveyed to the reflow furnace 6, and a soldering procedure is performed in the reflow furnace 6. Meanwhile, when the CPU 71 of the control device 70 determines that mounting deviation is present ire any of the components C which are mounted onto the board 18 ("YES" in step S110), the CPU 71 acquires the component information, the mounting position P, the positional deviation amount ΔP, and the rotational deviation amount Δθ of the component C which is the correction target (a target component) in which it is determined that mounting deviation is present (step S120), and determines whether or not the acquired mounting position P is within the warning region of the board 18 (step S130). When the CPU 71 of the control device 70 determines that the mounting position P is within the warning region, the CPU 71 performs a predetermined warning (step S140) and proceeds to step S150, and when the CPU 71 determines that the mounting position P is not within the warning region, the CPU 71 skips the process of step S140 and proceeds to the process of step S150. The process of step S140 is performed by the control device 70 transmitting a warning signal to the management device 80. The management device 80 which receives the warning signal displays a warning screen on the display 88. FIG. 11 is an explanatory diagram illustrating an example of the warning region. As described earlier, since the back-up pins 34 which support the reverse surface of the board 18 are provided to stand on the circumferential edge portion of the back-up plate 32, the center portion of the board 18 which is not supported by the back-up pins 34 (the hatched region of FIG. 11) is easily warped in relation to pushing in the Z-axis direction in comparison to the circumferential edge portion. Meanwhile, as described later, since the correction work of the mounting deviation is performed by causing the abutting surface 51a of the pad jig 51 to come into contact with the correction target component C and moving the component C in the horizontal direction using the friction force between the abutting surface 51a and the component C, it is necessary to push the pad jig 51 into the component C with a comparatively strong force. Therefore, when the pad jig 51 is pushed into the component C which is mounted in the vicinity of the center portion of the board 18 which is not supported by the back-up pins 34 to perform the correction work of the mounting deviation, there is a possibility of the board 18 being warped or, in some cases, damaged. In this manner, the warning is performed in a case in which the mounting position P of the target component C is within the warning region in the process of step S140 in order to inform the worker beforehand that there is a possibility of the board 18 being warped or damaged in accordance with the correction work of the mounting deviation. In the present embodiment, the center portion of the board 18 is set to the warning region because the circumferential edge portion of the board 18 is supported by the back-up pins 34; however, in a case in which the inside of the circumferential edge portion of the board 18 is supported by the back-up pins 34, a region which is not supported by the back-up pins 34 becomes the warning region. In the present embodiment, in case in which the mounting position P of the target component C is within the warning region of the board 18, and the mounting deviation correction process proceeds after the warning is performed in relation to the worker, however, the configuration is not limited thereto, and a configuration may be adopted in which after the warning is performed, the mounting deviation correction process is interrupted, and permission is obtained from the worker as to whether or not to restart the mounting deviation correction process. A configuration may also be adopted in which after performing the warning, the mounting deviation correction process is ended (the mounting deviation correction work is not performed).

Next, the CPU 71 of the control device 70 controls the XY robot 40 (the X-axis actuator 44b and the Y-axis actuator 48b) such that the pad jig 51 moves directly over the mounting position P of the correction target component C (step S150), and controls a Z-axis actuator 54b to start the lowering of the pad jig 51 (step S160, refer to FIG. 9 (a)). The CPU 71 of the control device 70 determines whether or not the abutting surface 51a of the pad jig 51 is in contact with the correction target component C (step S170). It is possible to detect whether or not the abutting surface 51a of the pad jig 51 is in contact with the component C using the load cell 55. When the CPU 71 of the control device 70 detects that the abutting surface 51a of the pad jig 51 is in contact with the component C the CPU 71 sets a push-in amount E (for example, approximately 0.2 mm to 0.5 mm) of the pad jig 51 based on the component information (the shape, the size, and the like) of the correction target component C which is acquired in step S120 (step S180), and determines whether or not the pad jig 51 is further lowered from the state of being in contact with the component C by the push-in amount E which is set (step S190). Here, for the push-in amount E, values which are experimentally obtained in advance for each shape and size of component are used as values at which it is possible to hold the component C using the pushing force when the component C is pushed in by the pad jig 51, and at which the solder surface S is not scraped off (not pushed too much). When the CPU 71 of the control device 70 determines that the pad jig 51 is lowered to the push-in amount E, the CPU 71 stops the lowering of the pad jig 51 (step S200). Accordingly, the component C is held in a state of being pushed by the pad jig 51 (refer to FIG. 9 (b)). It is possible to perform the determination of step S190 by detecting the movement amount of the pad jig 51 from when the abutting surface 51a of the pad jig 51 comes into contact with the component C using the Z-axis positional sensor 54a, and determining whether or not the detected movement amount reaches the push-in amount E.

When the lowering of the pad jig 51 stops, the CPU 71 of the control device 70 performs the mounting deviation correction work by controlling the XY robot 40 (the X-axis actuator 44b and the Y-axis actuator 48b) and the θ-axis actuator 56 such that the pad jig 51 moves horizontally to a position at which both the positional deviation amount ΔP and the rotational deviation amount Δθ become zero (step S210, refer to FIG. 9 (c)). In this manner, by causing the pad jig 51 to move horizontally, the control device 70 is capable of causing the component C to move in the same direction as the pad jig 51 using the friction force, and it is possible to correct the mounting deviation of the component C.

The CPU 71 of the control device 70 determines whether or not the horizontal movement of the pad jig 51 is completed, that is, whether or not the mounting deviation correction work is completed (step S220), and when the CPU 71 determines that the mounting deviation correction work is completed, the CPU 71 starts the blowing of air from the blow hole 51b of the pad jig 51 by driving the blower 58 (step S230), and lifts the pad jig 51 by driving the Z-axis actuator 54b (step S240, refer to FIG. 9 (d)). Accordingly, the pad jig 51 separates from the component C smoothly due to the air pressure, and it is possible to suppress the occurrence of take-back of the component C after correcting the mounting deviation. When the CPU 71 of the control device 70 starts the lifting of the pad jig 51, the CPU 71 determines whether or not the pad jig 51 is lifted by a predetermined amount using the Z-axis positional sensor 54a (step 250), and when the CPU 71 determines that the pad jig 51 is lifted by the predetermined amount, the CPU 71 stops the blowing of air by stopping the driving of the blower 58 (step S260). The CPU 71 of the control device 70 determines whether or not another correction target component C is present (step S270), and when the CPU 71 determines that the other correction target component C is present, the CPU 71 returns to step S120 and repeats the mounting deviation correction process on the next correction target component C (steps S120 to S260), and when the CPU 71 determines that the other correction target component C is not present, the CPU 71 performs the mounting deviation inspection process of FIG. 10 again in order to inspect whether or not the mounting deviation correction work is correctly performed (step S280). When it is determined that there is no mounting deviation in any of the components C which are mounted onto the board 18 as a result of the mounting deviation inspection process ("NO" in step S290), the mounting deviation correction process routine is ended, and when it is determined that mounting deviation is present in any of the components C which are mounted onto the board 18 ("YES" in step S290), error output is performed (step S295), and the mounting deviation correction process routine is ended. The process of step S295 is performed by the control device 70 transmitting an error signal to the management device 80. The management device 80 which receives the error signal displays an error screen on the display 88.

According to the mounting deviation correction apparatus according to the present embodiment described above, in a case in which mounting deviation arises in the component C which is mounted onto the solder surface S of the board 18, the component C is moved using the friction force between the pad jig 51 and the component C to correct the mounting deviation by holding the component C using the pad jig 51 by pushing the pad jig 51 into the component C and causing the pad jig 51 to move horizontally in this state. Accordingly, it is possible to automatically correct the mounting deviation of the component C using a simple configuration. As a result, it is possible to automate the correction work which is performed by the manual work of the worker in the related art, and it is possible to greatly reduce the labor of the worker.

According to the mounting deviation correction apparatus 10 according to the present embodiment, because the push-in amount E of the pad jig 51 is set based on the component information (the size, the shape, and the like) of the correction target component C, and the pad jig 51 is further lowered to the push-in amount E from the state in which the abutting surface 51a comes into contact with the component C, it is possible to hold the component C with an appropriate pushing force to correct the mounting deviation regardless of the shape and the size of the component.

According to the mounting deviation correction apparatus 10 according to the present embodiment, when the blow hole 51b of air is formed in the abutting surface 51a between the pad jig 51 and the component C and the mounting deviation correction work is completed, because the pad jig 51 is lifted while blowing air from the blow hole b using the blower 58, it is possible to cause the pad jig 51 to separate from the component C using the air pressure, and it is possible to effectively suppress the occurrence of take-back of the component C after the mounting deviation correction work.

According to the mounting deviation correction apparatus 10 according to the present embodiment, because there back-up device 30 which backs up the reverse surface side of the board 18 using the back-up pins 34 which are provided to stand on the back-up plate 32 is provided, and a predetermined warning is performed in a case in which the correction target component C is present in the region (the warning region) of the board 18 which is not supported by the back-up pins 34, it becomes possible to suppress the occurrence of warping and damage to the board 18 beforehand when pushing the pad jig 51 into the component C to perform the mounting deviation correction work.

In the mounting deviation correction apparatus 10 according to the present embodiment, a configuration is adopted in which the component C is moved using the friction force to correct the mounting deviation thereof by causing the pad jig 51 to move horizontally in a state in which the abutting surface 51a is pushed into the component C; however, the configuration is not limited thereto, and a configuration may be adopted in which a vacuum, port is formed in the abutting surface of the pad jig and a vacuum pump (a vacuum, pump) which communicates with the vacuum port is provided, the component C is sucked to the abutting surface by driving the vacuum pump in a state in which the abutting surface is in contact with the component C, the pad jig is caused to move horizontally in the state in which the component C is sucked, and thus, the component C is moved to correct the mounting deviation thereof.

Figure 12:
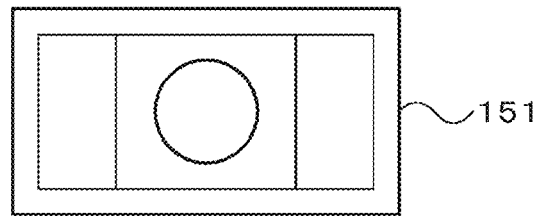
FIG. 12 is a configuration diagram schematically illustrating the configuration of a pad jig 151 of an alternative embodiment.
Figure 12:
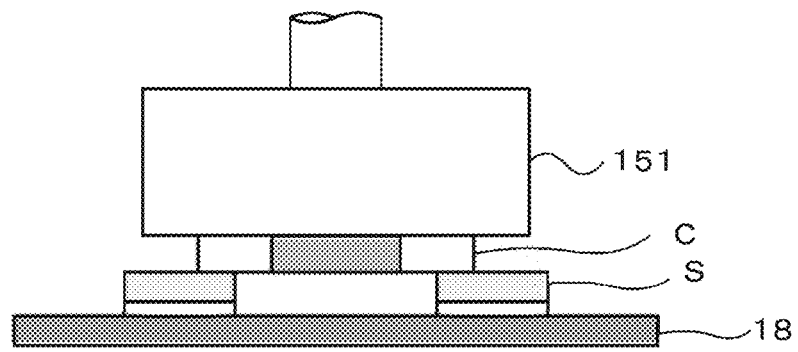
Figure 12:
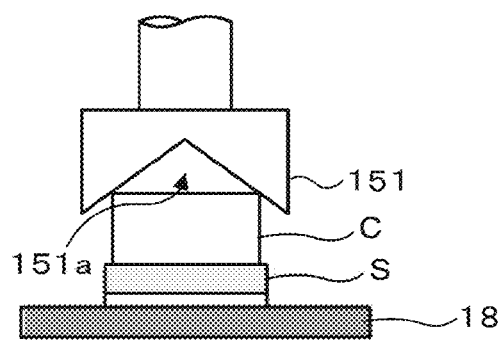
Figure 13:
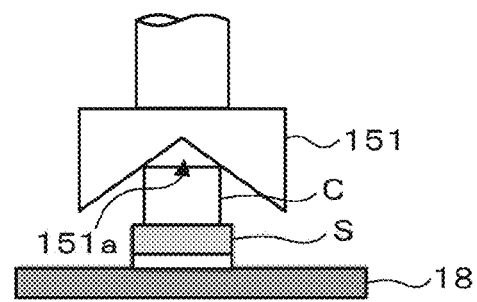
FIG. 13 is an explanatory diagram illustrating a state of holding a component of a different size using the pad jig 151 of the alternative embodiment.

According to the mounting deviation correction apparatus 10 according to the present embodiment, the abutting surface 51a of the pad jig 51 is formed as a planar surface; however, the configuration is not limited thereto, and, for example, as illustrated in FIG. 12, the pad jig 151 which includes a V-shaped valley portion 151a which comes into contact with the two opposite sides of the upper surface of the component C may be used as a jig which holds the substantially parallelepiped component C. In a case in which the substantially parallelepiped component C is held using the pad jig 151, the control device 70 may cause the pad jig 151 to move directly over the component C based on the mounting position P of the component C which is acquired in step S310 of the mounting deviation inspection process routine of FIG. 10, cause the pad jig 151 to rotate such that the directions of the two opposite sides of the component C match the directions in which the V-shaped groove of the valley portion 151a extends based on the rotational direction of the component C which is acquired in step S310 in the same manner, and subsequently, lower the pad jig 151 until the pad jig 151 makes contact with the component C. As illustrated in FIG. 13, the pad jig 151 may be used in the holding of a plurality of types of the component C which have different heights and widths as long as the component C is substantially parallelepiped. The valley portion 151a is not limited to a V-shaped valley portion, and may be arch (arc) shaped or trapezoidal. The pad jig 151 is not limited to abutting only the two opposite sides of the upper surface of the component C, and may be a shape (quadrangular pyramid type) which abuts all four sides, or a shape which abuts three sides of the top face of the component C.

Figure 14:
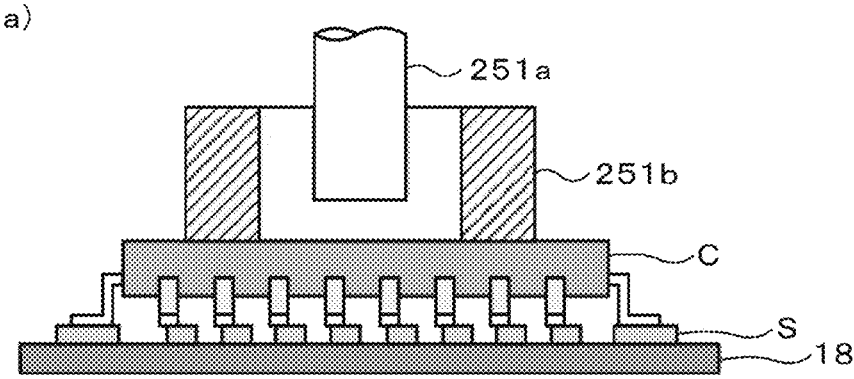
FIG. 14 is a configuration diagram schematically illustrating the configuration of a pad jig 251a and a weight member 251b of an alternative embodiment.
Figure 14:
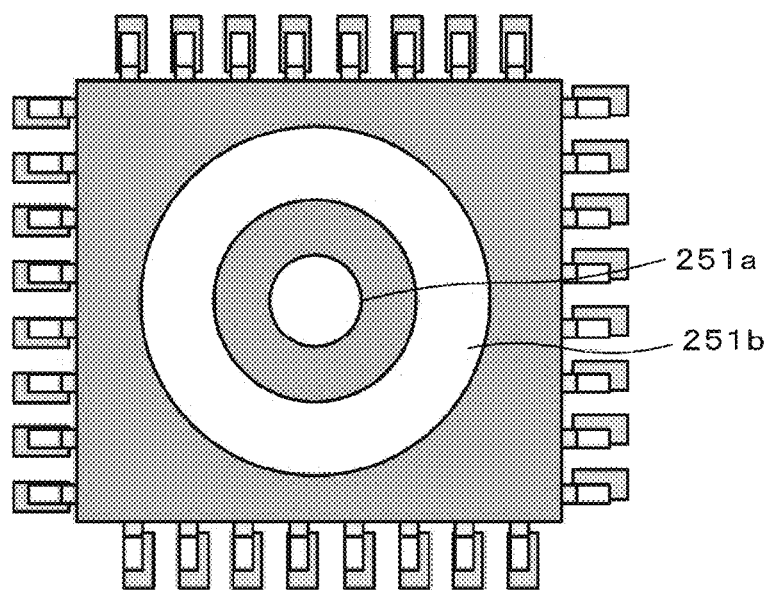

In the mounting deviation correction apparatus 10 according to the present embodiment, a configuration is adopted in which the blow hole 51b is formed in the abutting surface 51a of the pad jig 51, the mounting deviation of the component C is corrected in a state in which the component C is held by the abutting surface 51a of the pad jig 51, and subsequently, air is blown out from the blow hole 51b to cause the pad jig 51 to separate from the component C; however, the configuration is not limited thereto, and a configuration may be adopted in which for example, while not depicted in the drawings, a cylinder capable of reciprocally moving a rod is provided downward from the abutting surface of the pad jig, and after correcting the mounting deviation of the component C through the horizontal movement of the pad jig, the pad jig is separated from the component C by driving the cylinder to cause a rod tip to contact the component C and lifting the pad jig (the abutting surface) while maintaining the state in which the rod tip is in contact. As exemplified in FIG. 14, a configuration may be adopted in which, by providing the weight member 251b instead of the cylinder to be capable of movement in the Z-axis direction relative to the pad jig 251a, the component C is pressed by the weight of the weight member 251b, and the pad jig 251a is caused separate from the component C.

Figure 15:
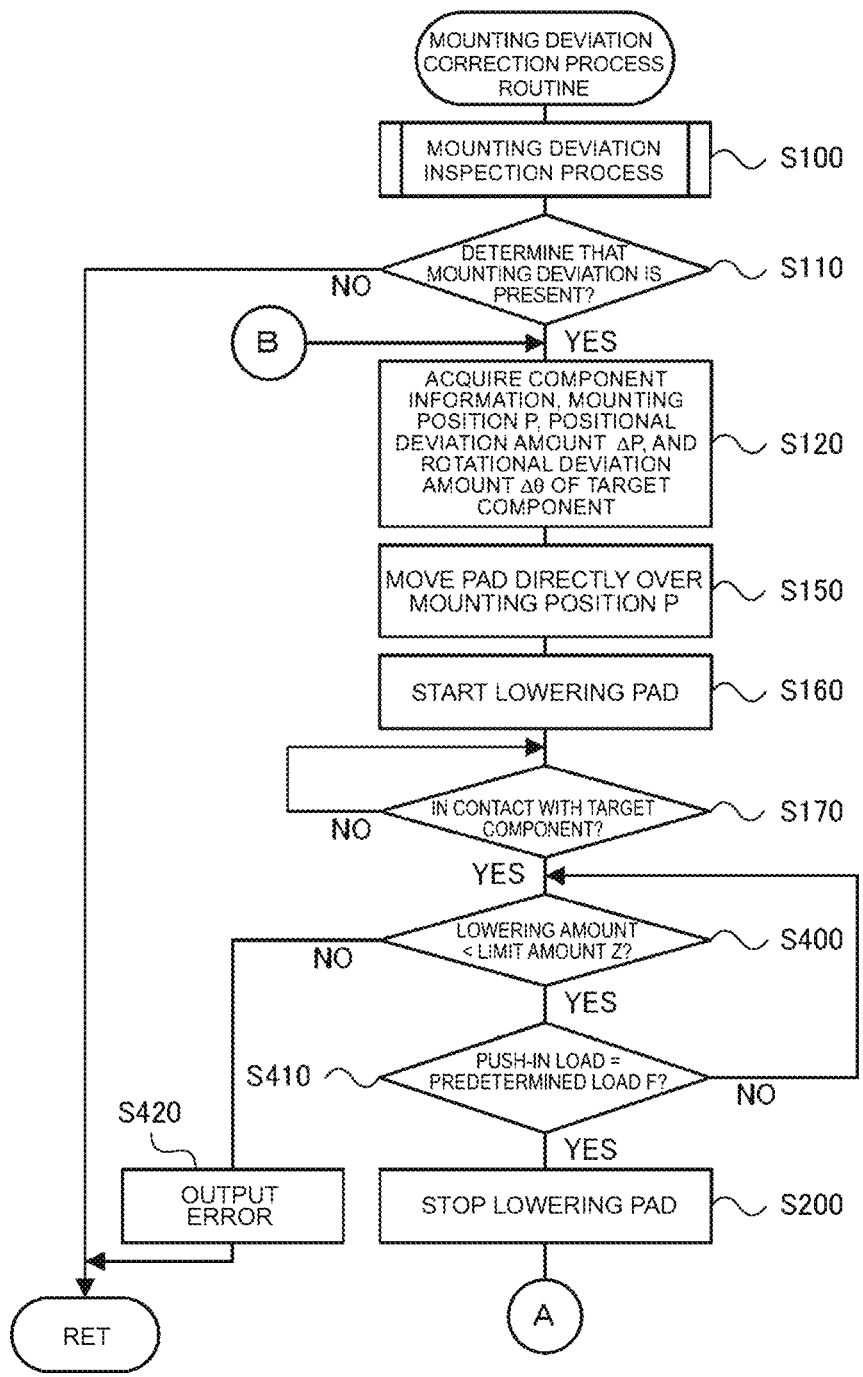
FIG. 15 is a flowchart illustrating a mounting deviation correction process routine of an alternative embodiment.

In the mounting deviation correction apparatus 10 according to the present embodiment, as depicted in steps S160 to S200 of the mounting deviation correction process routine of FIG. 7, a configuration is adopted in which, when holding the component C using the pad jig 51, from a state in which the abutting surface 51a is in contact with the component C, the pad jig 51 is further lowered to the push-in amount E using the detection signal from the Z-axis positional sensor 54a; however, the configuration is not limited thereto, and a configuration may be adopted in which the pad jig 51 is pushed in such that the push-in load exerted on the component C is a predetermined load F using the detection signal from the load cell 55. In this case, the CPU 71 of the control device 70 may execute the mounting deviation correction process routine of FIG. 15 instead of the mounting deviation correction process routine of FIG. 7. The mounting deviation correction process routine of FIG. 15 differs from the mounting deviation correction process routine of FIG. 7 in that steps S130 and S140 are omitted, and the processes of steps S400 to S420 are executed instead of those of steps S180 and S190. In the mounting deviation correction process routine of FIG. 15, the CPU 71 of the control device 70 starts lowering the pad jig 51 in step S160, and after determining that the abutting surface 51a of the pad jig 51 is in contact with the component C in step S170, determines whether or not the lowering amount (the push-in amount) of the pad jig 51 from the state in which the abutting surface 51a is in contact with the component C is less than a limit value Z based on the detection signal from the Z-axis positional sensor 54a (step S400), and determines whether or not the push-in load of the pad jig 51 reaches the predetermined load F based on the detection signal of the load cell 55 (step S410). Here, it is possible for the limit value Z to be a value which is experimentally obtained in advance as the push-in amount of the pad jig 51 at which warping of the board 18 arises, for example. When the CPU 71 of the control device 70 determines that the pushing load of the pad jig 51 reaches the predetermined load F before the lowering amount of the pad jig 51 becomes equal to or greater than the limit value Z, the CPU 71 stops the lowering of the pad jig 51 (step S200) and proceeds to the processes of step S210 onward, and when the CPU 71 determines that the lowering amount of the pad jig 51 becomes greater than or equal to the limit value Z, the CPU 71 determines that there is a possibility of warping or damage to the board 18, performs error output (step S420), and ends the mounting deviation correction process. The process of step S420 is performed by the control device 70 transmitting an error signal to the management device 80. The management device 80 which receives the error signal displays an error screen on the display 88. Here, in the alternative embodiment, when the lowering amount of the pad jig 51 becomes greater than or equal to the limit value Z before the pushing load of the pad jig 51 reaches the predetermined load F, the processes of steps S400 and S420 which perform the error output are executed; however, these processes may be omitted.

In the mounting deviation correction apparatus 10 according to the present embodiment, whether or not mounting deviation is present in the mounted components which are mounted onto the board 18 is inspected using the device; however, the configuration is not limited thereto. For example, an inspector which detects whether or not the mounting deviation is present may be disposed on a separate mounting line, that is, the mounting deviation correction apparatus 10 and the inspector may be respectively disposed alone on a mounting line, the mounting deviation correction apparatus 10 may be disposed alone and the inspector may be incorporated in the component mounting machine 4, and the mounting deviation correction apparatus 10 and the inspector may be incorporated in the component mounting machine 4. For example, a plurality of inspectors may be provided in relation to a plurality of the component mounting machines 4 as in the component mounting machine 4, the inspector, the component mounting machine 4, the inspector, and so on. In this case, a plurality of the mounting deviation correction apparatuses 10 may be disposed (plurality disposed) on the downstream side of the plurality of inspectors, respectively. The mounting deviation correction apparatus 10 may be incorporated in the component mounting machine 4. In this case, the component mounting machine 4 in which the mounting deviation correction apparatus 10 is incorporated acquires the positional information of the mounted component for which the mounting deviation is occurring from the inspector which is disposed on the upstream side of the component mounting machine 4, and is capable of correcting the mounting deviation of the mounted component based on the acquired positional information. The mounting deviation correction apparatus 10 may be disposed outside of the mounting line.

Here, description will be given of the correspondence relationship between the main elements of the present embodiment and the main elements of the disclosure described in the outline of the disclosure. In other words, the mounting deviation correction apparatus 10 corresponds to a "mounting deviation correction apparatus", the pad jig 51 corresponds to a "contact holding member", the XY robot 40, the Z-axis actuator 54, and the □-axis actuator 56 correspond to a "movement device", the CPU 71 of the control device 70 which executes the processes of steps S100 to S120 of the mounting deviation correction process routine of FIG. 7 and the mounting deviation inspection process routine of FIG. 10 corresponds to a "positional information acquisition device", the CPU 71 of the control device 70 which executes the processes of steps S150 to S200 of the mounting deviation correction process routine of FIG. 7 corresponds to a "contact holding control device", and the CPU 71 of the control device 70 which executes the process of step S210 of the mounting deviation correction process routine corresponds to a "mounting deviation correction control device". The blower 58, the internal passage 52*a*, and the blow hole 51*b* correspond to a "separating mechanism". The cylinder and the weight member 251*b* also correspond to the "separating mechanism". The CPU 71 of the control device 70 which executes the process of step S120 of the mounting deviation correction process routine of FIG. 7 corresponds to a "component information acquisition device". The back-up device 30 corresponds to a "support member", and the CPU 71 of the control device 70 which executes the processes of steps S130 and S140 of the mounting deviation correction process routine corresponds to a "warning device". The Z-axis positional sensor 54*a* corresponds to a "push-in amount detection device", and the processes of steps S400 and S420 of the mounting deviation correction process routine of FIG. 15 correspond to an "error information output device". The screen printer 2 corresponds to a "printer", the component mounting machine 4 corresponds to a "component mounting machine", and the reflow furnace 6 corresponds to a "reflow furnace".

Note that, the present invention is not limited to the embodiment described above, and, needless to say, may be implemented in various modes within the technical scope of the present invention.

INDUSTRIAL APPLICABILITY

The present invention may be used in the manufacturing industry of mounting deviation correction apparatuses and component mounting systems, or the like.

REFERENCE SIGNS LIST

1: component mounting system, 2: screen printer, 3: control device, 4: component mounting machine, 5: control device, 6: reflow furnace, 7: control device, 8: intermediate conveyor, 10: mounting deviation correction apparatus, 12: seat, 14: main body frame, 16: support table, 18: board, 20: board conveyance device, 22: belt conveyor device, 30: back-up device, 32: back-up plate, 34: back-up pin, 40: XY robot, 42: X-axis guide rail, 44: X-axis slider, 44*a*: X-axis positional sensor, 44*b*: X-axis actuator, 46: Y-axis guide rail, 48: Y-axis slider, 48*a*: Y-axis positional sensor, 48*b*: Y-axis actuator, 50: head, 51, 151, 251*a*: pad jig, 51*a*: abutting surface, 51*b*: blow hole, 52: jig holder, 52*a*: internal passage, 54: Z-axis actuator, 54*a*: Z-axis positional sensor, 55: load cell, 56: θ-axis actuator, 58: blower, 60: camera, 70: control device, 71: CPU, 72: ROM, 73: HDD, 74: RAM, 75: input and output interface, 76: bus, 80: management device, 81: CPU, 82: ROM, 83: HDD, 84: RAM, 85: input and output interface, 86: bus, 87: input device, 88: display, 251*b*: weight member

The invention claimed is:

1. A mounting deviation correction apparatus which corrects mounting deviation of a mounted component which is mounted onto a board, comprising:
   a contact holding member which includes an abutting section which holds the mounted component, the abutting section including a friction member configured to contact an upper surface of the mounted component that is opposite to a mounting surface of the mounted component which is mounted to the board;
   a movement device that moves the contact holding member;
   a positional information acquisition device that acquires positional information of the mounted component in which mounting deviation is arising in relation to the board;
   a contact holding control device for controlling the movement device such that the contact holding member is moved in a mounting direction of the component until the abutting section contacts the upper surface and holds the mounted component in which the mounting deviation is arising based on the acquired positional information; and
   a mounting deviation correction control device that controls the movement device such that the contact holding member moves in a direction perpendicular to the mounting direction using a friction force between the friction member and the upper surface of the component, the movement cancelling out the mounting deviation of the mounted component based on the positional information which is acquired in a state in which the abutting section holds the mounted component,
   wherein the abutting section includes a valley-shaped abutting surface which comes into contact with at least two opposite sides of the upper surface of the mounted component.

2. The mounting deviation correction apparatus according to claim 1,
   wherein the contact holding control device is a device that controls the movement device so as to cause the abutting surface to push the mounted component.

3. The mounting deviation correction apparatus according to claim 1,
   wherein the mounted component is a rectangular prism shaped component.

4. The mounting deviation correction apparatus according to claim 1,
   wherein the abutting section includes a separating mechanism which moves the contact holding member in a direction opposite to the mounting direction in a state in which the abutting section holds the mounted component, and subsequently causes the abutting section to separate from the mounted component.

5. The mounting deviation correction apparatus according to claim 1, further comprising:
   a component information acquisition device that acquires component information relating to a shape of the mounted component,
   wherein the contact holding control device is a device that controls the movement device such that the abutting section pushes the mounted component based on the acquired component information.

6. The mounting deviation correction apparatus according to claim 5, further comprising:
   a support member which supports the board at a predetermined position; and a warning device that performs a predetermined warning in a case in which a mounting position of the mounted component which is specified based on the acquired positional information is not within a predetermined region including the predetermined position.

7. The mounting deviation correction apparatus according to claim 5, further comprising:
a push-in amount detection device that detects a push-in amount of the abutting section when contacting the upper surface of the mounted component; and
an error information output device that outputs error information in a case in which the detected push-in amount exceeds a predetermined amount.

8. The mounting deviation correction apparatus according to claim 1, further comprising:
an inspection device that inspects whether or not mounting deviation is present in the mounted component which is a control target after the controlling by the mounting deviation correction control device.

9. A component mounting system which configures a mounting line which is provided with a printer which prints solder onto a board, a component mounting machine which mounts a component onto the board onto which the solder is printed by the printer, an inspector which inspects whether or not mounting deviation is present in the component which is mounted onto the board, and a reflow furnace which melts the solder by heating the board after the inspecting to perform soldering, the component mounting system comprising:
the mounting deviation correction apparatus according to claim 1 which corrects the mounting deviation of the mounted component for which it is determined by the inspector that the mounting deviation is occurring,
wherein the mounting deviation correction apparatus is incorporated in the mounting line.

10. The mounting deviation correction apparatus according to claim 1,
wherein the valley-shaped abutting surface is a V-shaped groove.

11. The mounting deviation correction apparatus according to claim 1,
wherein the contact holding control device controls the movement device to move the abutting section in the mounting direction, after contact is made with the upper surface of the mounted component, to push the mounted component a set push-in amount based on the acquired component information.

* * * * *